United States Patent [19]

Imamura

[11] 4,147,987
[45] Apr. 3, 1979

[54] SUPERHETERODYNE RECEIVER OF SCANNING TYPE

[75] Inventor: Eigo Imamura, Kusatsu, Japan

[73] Assignee: Sanyo Electric Co., Ltd., Moriguchi, Japan

[21] Appl. No.: 756,831

[22] Filed: Jan. 5, 1977

[30] Foreign Application Priority Data

Jan. 19, 1976 [JP] Japan .................................. 51-6271
May 31, 1976 [JP] Japan .................................. 51-64798
Jul. 27, 1976 [JP] Japan .................................. 51-90595
Sep. 14, 1976 [JP] Japan .................................. 51-111078

[51] Int. Cl.$^2$ ............................................ H04B 1/32
[52] U.S. Cl. .................................... 325/455; 325/459; 325/470
[58] Field of Search .............................. 358/191–193; 325/453, 458, 459, 464, 468, 470, 418–423, 335, 17, 25, 455; 334/15; 331/1 A, 18, 25

[56] References Cited

U.S. PATENT DOCUMENTS

| 3,845,394 | 10/1974 | Hamada | 325/455 |
|---|---|---|---|
| 3,961,261 | 6/1976 | Pflasterer | 325/470 |
| 3,973,205 | 8/1976 | Tanaka | 325/455 |
| 3,987,400 | 10/1976 | Fathauer | 325/470 |
| 4,009,440 | 2/1977 | Okada et al. | 325/335 |
| 4,027,251 | 5/1977 | Fathauer et al. | 325/470 |

*Primary Examiner*—Robert L. Griffin
*Assistant Examiner*—Marc E. Bookbinder
*Attorney, Agent, or Firm*—Darby & Darby

[57] ABSTRACT

A superheterodyne receiver of a scanning type, comprising a high frequency amplifier, a mixer, a local oscillator, an intermediate frequency amplifier, a detector, an audio frequency amplifier, a loud speaker, and an automatic scanning/manual scanning selecting switch, said local oscillator comprising a digital frequency synthesizer comprising a voltage controlled oscillator, a programmable frequency divider for dividing the frequency of the output from the voltage controlled oscillator, a reference oscillator, a random access memory for storing the information concerning the rate of the frequency division by the frequency divider, and a phase detector for phase detecting the frequencies of the outputs from the reference oscillator and the frequency divider for providing a control voltage to said voltage controlled oscillator, said receiver further comprising an astable multivibrator for generating pulses for scanning the frequencies of the receiving bands, a counter for counting the pulses from the astable multivibrator, a decoder for decoding the count output from the counter, a plurality of light emitting diodes correspondingly coupled to the decoder output, a plurality of switching transistors connected to a plurality of bit parallel outputs of the random access memory, a plurality of switches for presetting in the random access memory the information concerning the rate of frequency division by the frequency divider corresponding to a predetermined channel, a squelch circuit responsive to a noise detected output obtained when the said detector detects a noise for disabling the audio frequency amplifier, a plurality of undesired channel setting switches for presetting a channel reception of which is not desired, and a switching transistor responsive to the reception of the frequency corresponding to the channel as set by the said undesired channel setting switch for providing a potential for forcibly enabling the said squelch circuit for disabling the audio frequency amplifier.

18 Claims, 7 Drawing Figures

SUPERHETERODYNE RECEIVER OF SCANNING TYPE

BACKGROUND OF THE INVENTION

1. Field of the Invention

The present invention relates to a scanning receiver. More specifically, the present invention relates to a receiver of a scanning type employing a digital frequency synthesizer employing a phase locked loop.

2. Description of the Prior Art

In the United States, for example, various kinds of information centering on the news have been broadcast on occasion using the broadcasting bands other than the general radio broadcasting bands. Such special purpose broadcasting is referred to as public service broadcasting, or P.S.B., and the carrier wave frequencies in the channels for such broadcasting are 30 through 50 MHz (low VHF band), 150 through 170 MHz (high VHF band), and 450 through 470 MHz (UHF band), which use frequency modulation signals. The public service broadcasting bands have been utilized for fire service, public security, highway patrol, weather forecast and the like. In such broadcasting, the program is not always broadcast but rather is broadcast upon occasion. Broadcasting frequencies have been allotted to the broadcasting channels normally at intervals of about 25 KHz.

In order to receive the frequency of a desired channel in such broadcasting, a scanning receiver is utilized. A typical prior art scanning receiver comprises a local oscillator circuit structured such that a desired crystal resonator can be selectively replaced. A desired one of a plurality of crystal resonators each allotted to a channel is sequentially selected automatically or manually in the local oscillator circuit by grounding the desired one of the crystal resonators to complete a circuit connection, whereby channel selection is achieved and a desired broadcasting frequency is received.

Meanwhile, a frequency scanning receiver of a frequency synthesizer type has been developed and put into practical use wherein a phase locked loop is employed as a local oscillator circuit.

A frequency synthesizer employing a phase locked loop usually comprises a voltage controlled oscillator the oscillation frequency of which is controllable as a function of an output voltage, as low pass filtered, obtainable from a phase detector, which is adapted to compare the phase or the frequency of the output from a reference oscillator and the phase or the frequency of an output from a programmable frequency divider adapted to frequency divide the output frequency from the said voltage controlled oscillator at the frequency division rate which is adapted to be variable as a function of a control signal. Automatic scanning of the oscillation frequency of the output from the said voltage controlled oscillator is effected by varying the said control signal and thus the frequency division rate of the programmable frequency divider. Therefore, if such a voltage controlled oscillator is used as a local oscillator of a tuner of a radio receiver, automatic scanning of the receiving frequency can be effected by varying the frequency division rate of the programmable frequency devider, as described above. Typically, the data concerning the frequency division rate of the programmable frequency divider, the receiving frequency band, and the like is stored in advance for each channel by presetting the data in a channel selection memory. Although it is desired to display the data stored in the channel selection memory by the use of a digital display, such an approach would be extremely expensive.

In general, a typical scanning receiver of a frequency synthesizer type often uses light emitting devices for the purpose of indication of a received channel. Therefore, skillful use of such light emitting devices to provide a visual indication of the data stored in the channel selection memory might enable an inexpensive implementation of a display for the data stored in the channel station selection memory.

Such a scanning receiver is usually structured such that an undesired channel is automatically skipped in the scanning operation, in order to disregard such an undesired channel so as to disable reception thereof. However, the conventional skip scanning scheme has been applied to a scanning receiver comprising a plurality of crystal resonators, as described above, wherein a crystal resonator corresponding to an undesired channel is prevented from being grounded by means of a channel skip instructing switch, whereby the said crystal resonator is prevented from being coupled to the local oscillator. However, according to the said scheme, in case where channel selection is effected by a scanning operation, with a squelch circuit disabled or turned off, particularly in a weak signal situation, a discordant noise is heard by the speaker each time the channel as set as not receivable is selected during the scanning operation i.e. each time the channel as set as not receivable is reached in the scanning operation.

Apparently, the above described scheme cannot be applied to a frequency scanning receiver of a frequency synthesizer type. Instead, it could be thought that a channel skip instructing switch is provided so as to disable the operation of a voltage controlled oscillator constituting a phase locked loop if and when such a channel is selected in the scanning operation. Nevertheless, if once the operation of the voltage controlled oscillator is disabled, it takes a time period until the voltage controlled oscillator starts again to operate to provide a predetermined oscillation frequency, such time period being generally referred to as a lock up time. Hence, it is necessary to select the time period required for shifting of one channel to be longer than the lock up time. As a result, such scheme has shortcomings that in selection of the channel by an automatic scanning operation, particularly in case of selection of an increased number of channels, much longer time is required for the scanning operation.

A conventional scanning receiver capable of receiving a plurality of bands comprises a band switching circuit, as disclosed in U.S. Pat. No. 3,665,318, for example, wherein the same number of switching devices such as switching transistors as the number of bands are provided. The band switching circuit is structured such that a manual band switching means provided at the input of each of the switching transistors is selectively set to a predetermined band for each channel and the input terminal of the switching transistor of the predetermined band is connected to a scanning signal oscillator for sequentially grounding the crystal oscillators, whereby the high frequency amplifier and mixer of the respective band is selectively energized through conduction of corresponding switching transistor. A different band switching circuit has also been disclosed in the United States patent application, Ser. No. 566,831 filed Apr. 10, 1975 now U.S. Pat. No. 4,000,470 and assigned to the same assignee as that of the present application, wherein band switching is effected by inserting a desired crystal oscillator into a corresponding receptacle out of a plurality of sets of crystal oscillator receptacles each provided for a channel by employing the same number of switching transistors as the number of bands. Nevertheless, if any of the above described prior art band switching circuits is employed in a frequency scanning receiver of a frequency synthesizer type, the circuit configuration becomes extremely complicated.

SUMMARY OF THE INVENTION

Briefly described, the present invention comprises a superheterodyne receiver of a scanning type, comprising means for receiving a high frequency signal, said high frequency signal including a plurality of channels of different frequencies, local oscillator means for providing an oscillation frequency signal the frequency of which is different by a given frequency difference from said received high frequency signal, mixing means responsive to said received high frequency signal and said local oscillation frequency signal for providing an intermediate frequency signal, means for amplifying the intermediate frequency signal from said mixing means, means for detecting the intermediate frequency output from said intermediate frequency amplifying means, for providing an audio frequency signal, and audio frequency amplifying means for amplifying the audio frequency output from said detecting means; said local oscillator means comprising, voltage controlled oscillator means for providing an oscillation frequency signal the oscillation frequency of which is variable as a function of a given control voltage, means for modifying the oscillation frequency of the output from said voltage controlled oscillator means, for controlling the rate of frequency modification of said oscillation frequency modifying means, means responsive to the output from said oscillation frequency modifying means, as modified at the frequency modification rate controlled by said frequency modification rate controlling means, for providing a control voltage associated with the frequency of the output from said oscillation frequency modification means to said voaltage controlled oscillator means, whereby said local oscillator means is adapted to provide a local oscillation frequency signal the frequency of which is associated with the frequency modification rate, as controlled by said frequency modification rate controlling means, said receiver further comprising, means for generating a signal for scanning a plurality of channels to be received by said receiver for sequentially specifying such channels, means responsive to the output from said scanning signal generating means for accommodating the control of the frequency modification rate by said frequency modification rate controlling means for enabling reception of the frequency of the corresponding receiving channel, means for detecting a noise for disabling transmission of said audio frequency signal, means for selectively disabling a specifying operation of an undesired channel out of said plurality of channels being specified by said scanning signal generating means for causing a skip scanning operation with respect to said undesired channel being specified by said scanning signal generating means, and means responsive to said detecting means for positively enabling said audio signal transmission disabling means when an undesired channel frequency is received.

Therefore, it is a principal object of the present invention is to provide an improved scanning receiver employing a frequency synthesizer employing a phase locked loop, wherein an undesired channel is positively made unreceivable without stopping the operation of a voltage controlled oscillator, while the said undesired channel is automatically disregarded in the scanning operation of the channels.

It is another object of the present invention is to provide an improved scanning receiver employing a frequency synthesizer employing a phase locked loop, wherein light emitting devices for displaying a received channel provided in the receiver are adapted to be commonly used for displaying the data to be stored in a channel selection memory to be provided for storing the data of the channels to be selected.

It is a further object of the present invention to provide an improved scanning receiver employing a frequency synthesizer employing a phase locked loop, wherein band switching is effected by applying a control input to band switching transistors the number of which is less by one than the number of bands.

These objects and other objects, features, aspects and advantages of the present invention will be better understood from the following detailed description of the preferred embodiment of the present invention when taken in conjunction with the accompanying drawings.

DESCRIPTION OF THE PREFERRED EMBODIMENTS

Figure 1:
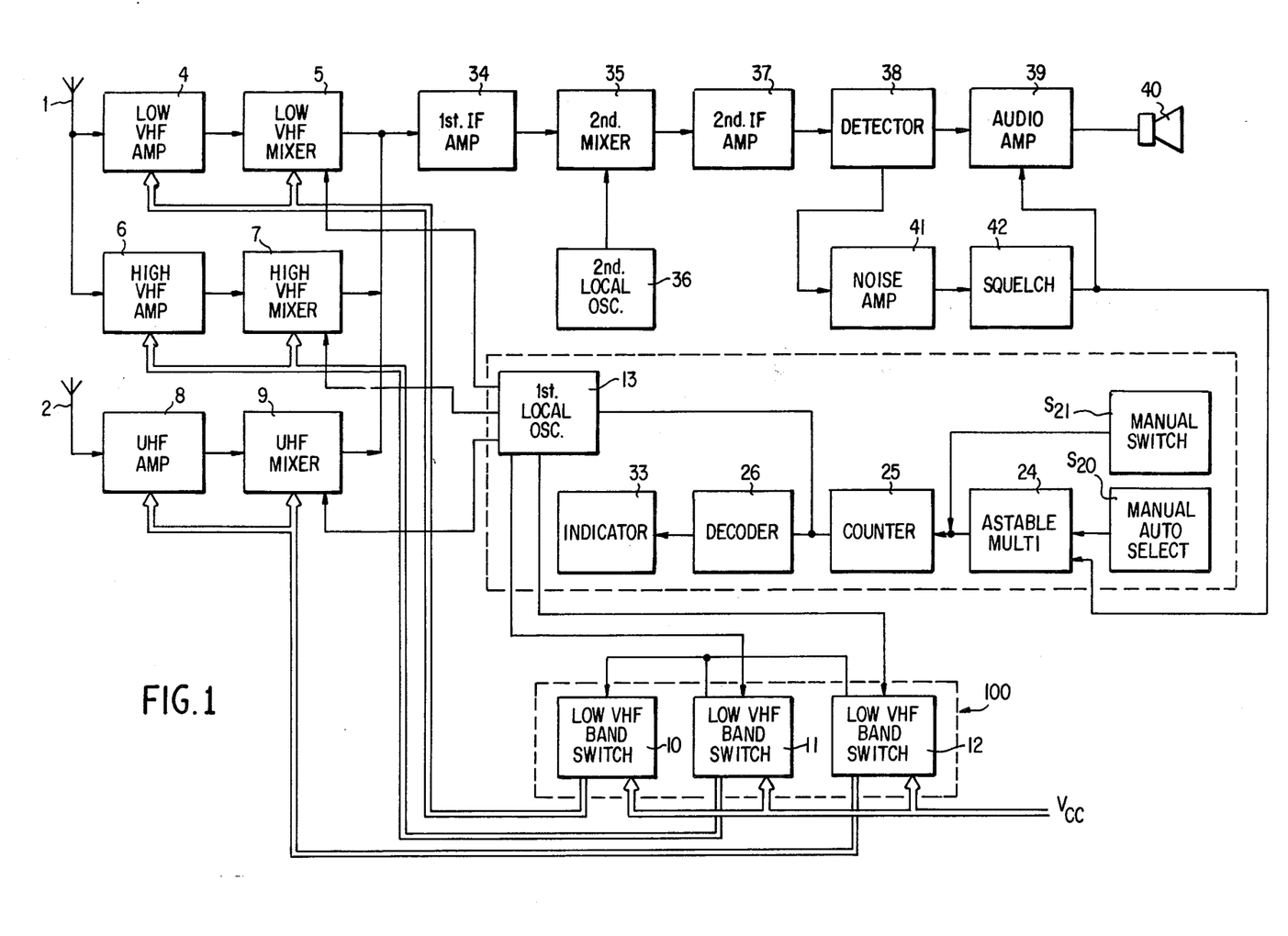
FIG. 1 is a block diagram of a scanning receiver showing the background of the present invention, wherein a display for displaying the data stored in a channel selection memory to be described subsequently can be advantageously employed.

FIG. 1 is a block diagram of a scanning receiver showing the background of the present invention, in which a display for displaying the data stored in a channel selection memory to be described subsequently can be advanntageously employed. The receiver shown comprises a first antenna 1 for receiving a broadcasting wave of VHF band, a second antenna 2 for receiving a broadcasting wave of UHF band, a first radio frequency amplifier 4 for amplifying the received broadcasting wave of low VHF band, a first mixer 5 for mixing the radio frequency output from the amplifier 4 with a first local oscillation frequency output to be described subsequently for providing an intermediate frequency output, a second radio frequency amplifier 6 for amplifying the received broadcasting wave of high VHF band, a second mixer 7 for mixing the radio frequency output from the amplifier 6 with the first local oscillation frequency output for providing an intermediate frequency output, a third radio frequency amplifier 8 for amplifying the received broadcasting wave of UHF band, a third mixer 9 for mixing the radio frequency output from the amplifier 8 with the first local oscillation frequency output for providing an intermediate frequency output, a first intermediate frequency amplifier 34 for amplifying the intermediate frequency output from the mixer 5, 7 or 9, a second mixer 35 for mixing the intermediate frequency output from the first intermediate frequency amplifier 34 with the output from a second local oscillator 36 for providing a second intermediate frequency output, a second intermediate frequency amplifier 37 for amplifying the second intermediate output from the mixer 35, a detector 38 for detecting the intermediate frequency output from the second amplifier 37 for providing an audio frequency output, an audio frequency amplifier 39 for amplifying the audio frequency output from the detector 38, and a loud speaker 40 for transducing the audio frequency output from the amplifier 39 into a sound output. The receiver further comprises a noise amplifier coupled to the detector 38 for amplifying a noise component output from the detector 38, and a squelch circuit 42 responsive to the noise component output from the noise amplifier 41 for disabling the audio amplifier 39 for the squelching purpose. The output from the squelch circuit 42 is also applied to an astable multivibrator 24 constituting a pulse generator. An autmatic scanning/manual scanning selection circuit S20 is coupled to the multivibrator 24 for selecting an automatic scanning or manual scanning mode of the scanning operation by the receiver. The pulse output from the astable multivibrator 24 is applied to a pulse counter 25. The pulse counter 25 serves to provide a binary coded output by counting the number of the pulse outputs of a decimal input. The said binary coded output from the counter 25 is converted sequentially to a scanning signal of the zero level, as to be described subsequently. The decoder 26 is utilized as a driver circuit for driving light emitting devices for indicating the channels which are included in an indicator 33 to be described subsequently. The output from the counter 25 is also applied to the above described first local oscillator 13. The portion encircled with a dotted line in FIG. 1 including the astable multivibrator 24, the counter 25, the decoder 26 and the like, constitutes an essential portion of the present invention and is shown in more detail in FIG. 2.

The receiver shown in FIG. 1 further comprises a band select circuit 100 for selecting a desired band. The band select circuit 100 comprises a low VHF band selecting switch 10, a high VHF band selecting switch 11, and a UHF band selecting switch 12. These switches 10, 11 and 12 are each connected to a voltage source $+V_{cc}$ commonly at one ends thereof and are individually connected at the other ends thereof to the corresponding radio frequency amplifiers 4, 6, and 7 mixers 5, 7 and 9, respectively, such that when one of the switches 10, 11, and 12 is selected the corresponding radio frequency amplifier and mixer are selectively energized.

Figure 2:
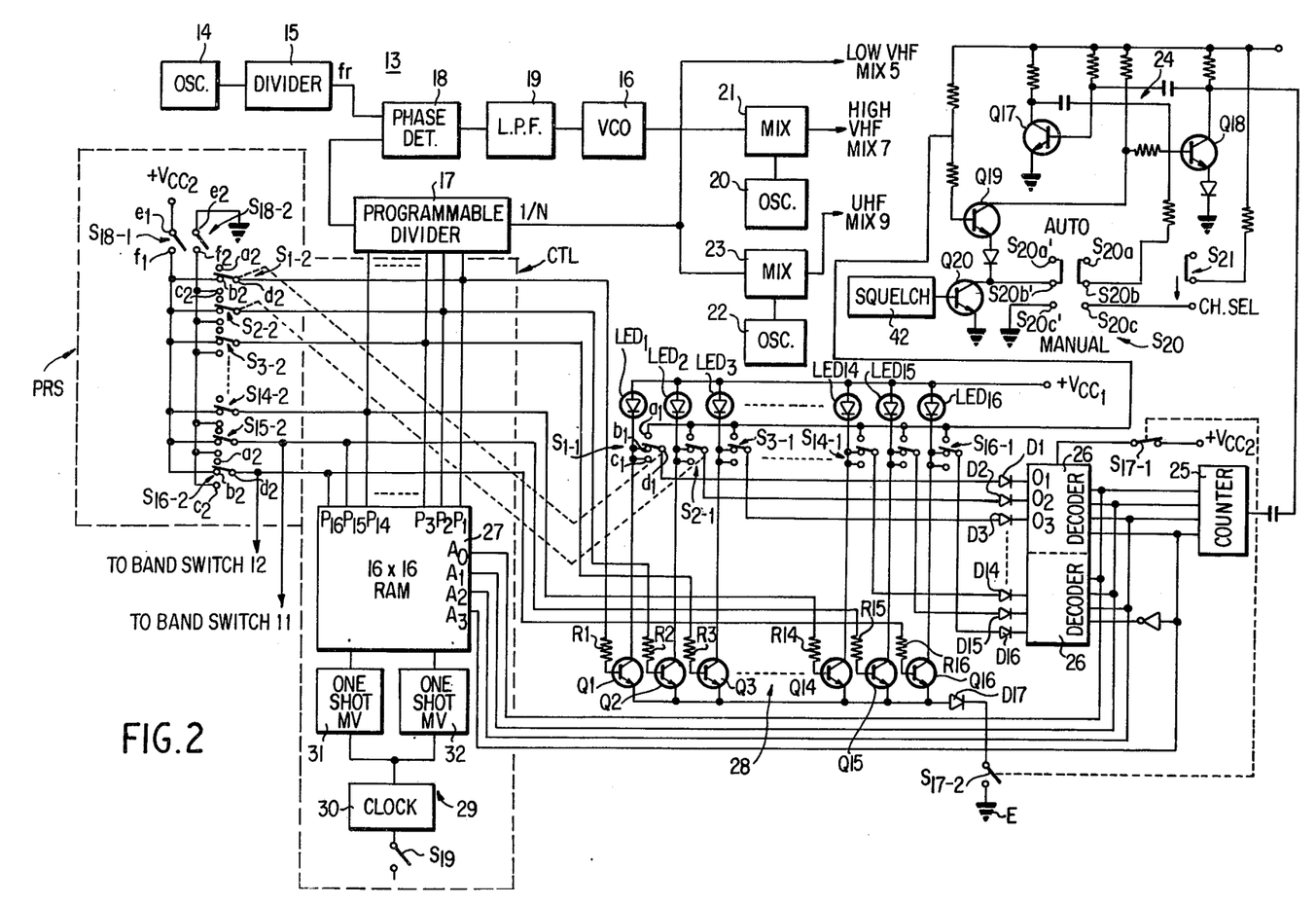
FIG. 2 shows a schematic diagram showing in more detail the portion encircled in a dotted line in FIG. 1.

FIG. 2 is a schematic diagram showing in more detail the portion encircled with a dotted line in FIG. 1. The first local oscillator 13 comprises a frequency synthesizer employing a phase locked loop (PLL). The first local oscillator 13 comprises a voltage controlled oscillator 16. The voltage controlled oscillator 16 is structured such that the oscillation frequency thereof is varied as a function of a control voltage applied thereto. In the receiver shown, such a control voltage is provided as an output from a phase detector 18, as filtered by means of a low pass filter 19. The phase detector 18 is connected to receive, at one input thereto, an output from a frequency divider 15, which is connected to receive an output from a reference oscillator 14. The phase detector 18 is also connected to receive, at the other input thereto, an output from a programmable frequency divider 17, which typically comprises a programmable counter. The programmable frequency divider 17 is connected to receive a control signal from a control CTL for the purpose of controlling the programmed rate of the frequency division by the programmable frequency divider 17. Before enterring into a detailed description of the control CTL, general information concerning the operation of the frequency synthesizer will be given.

Referring to FIG. 2, let it be assumed that the frequency as divided by the frequency divider 15 of the oscillation frequency of the output from the reference oscillator 14 is $f_r$, the oscillation frequency of the voltage controlled oscillator 16 is $f_0$, and the rate of the frequency division by the programmable frequency divider 17 is $1/N$ where N is a positive integer. A phase locked loop is established such that the frequency of the input to the phase detector 18, i.e. the frequency $f_r$ comes to coincide with the frequency $f_0/N$, namely the relation $f_r = f_0/N$ is attained and, by varying the rate of frequency division $1/N$ by means of the control CTL, the output of a desired frequency can be obtained from the voltage controlled oscillator 16. In general, the said output of a desired frequency is utilized as a local oscillation output.

In case of the FIG. 1 embodiment, the output from the voltage controlled oscillator 16 is directly applied to the mixer 5 for the low VHF band, while the output from the voltage controlled oscillator 16 and the output from the reference oscillator 20 are mixed by the mixer 21 to provide a frequency increased output, which is applied to the mixer 7 for the high VHF band, and the output from the voltage controlled oscillator 16 and the output from the reference oscillator 22 are mixed by the mixer 23 to provide a frequency increased output, which is applied to the mixer 9 for the UHF band.

The astable multivibrator 24 utilized as a pulse generator comprises a pair of transistors Q17 and Q18 of a collector-base coupling type. The pulse output from the astable multivibrator 24 is applied to the pulse counter 25 as a decimal input. The pulse counter 25 serves to count the number of pulses from the astable multivibrator 24, thereby to provide a binary coded bit parallel output of 4 bits, which is applied to the subsequent decoder 26 and is also applied to a random access memory 27 included in the control CTL. The decoder 26 comprises two decoder portions each receiving the 4-bit output from the counter 25, each of which serves to decode the 4-bit signal into 8 individual output terminals. As a result, the decoder 26 comprises eight input terminals and sixteen output terminals O1 through O16. The decoder 26 is utilized as a driver circuit for driving light emitting devices LED1 through LED16 for displaying the channels, as to be described subsequently.

The said channel indicating light emitting devices LED1 through LED16 each may comprise a light emitting diode, for example, an anode of which is commonly connected to a positive voltage source $+V_{cc1}$ and a cathode of which is connected to the corresponding one of the channel skip instructing switches S1-1 through S16-1 to be described subsequently. These switches S1-1 through S16-1 are provided to correspond individually to the first through sixteenth channels, respectively, such that each switch is independently operated. Preferably, each of these switches may be a three-position switch having three stationary contacts a1, b1 and c1 and a movable contact d1. The first stationary contacts a1 of these switches S1-1 through S16-1 are commonly connected to the base electrode of the transistor Q19 for channel skip control. The second and third stationary contacts b1 and c1 of these switches S1-1 through S16-1 are connected to the cathode electrodes of the said light emitting diodes LED1 through LED16, respectively. The movable contacts d1 of these switches S1-1 through S16-1 are connected through the diodes D1 through D16, respectively, to the output terminals 01 through O16, respectvely, of the docoder 26. These channel skip instructing switches S1-1 through S16-1 are manually operated such that the switch corresponding to the channel which the operator does not wish to listen to is set to the first stationary contact a1, whereby the said channel is skipped in the scanning operation to the following channel.

Figure 4:
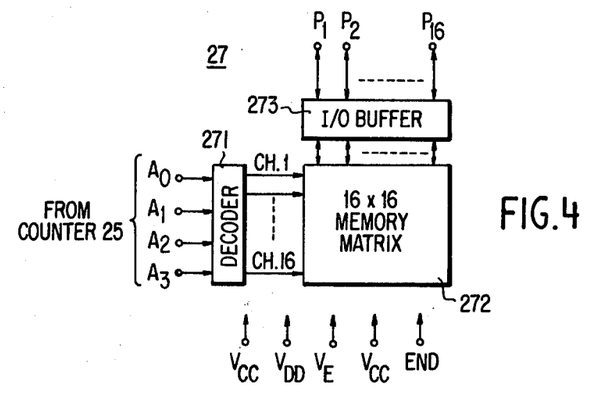
FIG. 4 is a block diagram showing in more detail a random access memory 27 in the FIG. 2 embodiment.

The control CTL comprises a non-volatile random access memory 27 of 16 addresses × 16 bits for use in preset channel selection. The non-volatile random access memory 27 serves to store in advance for each channel the data concerning the frequency division rate to be performed by the programmable frequency divider 17 in the scanning receiver of a frequency synthesizer system. A more detailed block diagram of the memory 27 is shown in FIG. 4. With simultaneous reference to FIG. 4, the memory 27 comprises a decoder 271 for converting 4-bit parallel binary address input signal obtained from the pulse counter 25 into a decimal address signal, a 16 × 16 memory matrix 272, and an input/output buffer 273. If and when a non-volatile memory is utilized as a channel selection memory as described with reference to the FIG. 2 embodiment, it is not necessary to provide a direct current power supply for holding the data stored in the memory. Of the 16 bit output terminals of the random access memory 27, the 14 bit output terminals P1 through P14 are utilized as control inputs to the said programmable frequency divider 17, while the remaining 2 bit output terminals P15 and P16 are utilized as band switching inputs of the scanning receiver of plural-band type (in the embodiment shown, 3-band). The output terminal P15 is connected to the band switching circuit 11 in the band selecting circuit 100 in FIG. 1 and the output terminal P16 is connected to the band switching circuit 12.

The control CTL further comprises a write control pulse generator 29 for use in entering the data into the random access memory 27. The pulse generator 29 comprises a normally open switch S19, a clock pulse generator 30, and two one shot multivibrators 31 and 32 responsive to the output from the clock pulse generator 30 to be triggered.

A driver circuit 28 for displaying the data stored in the memory 27 is provided for the purpose of displaying by means of the indicator 33 the data corresponding to a desired channel stored in the random access memory 27 in the control CTL. The driver circuit 28 comprises sixteen switching devices, such as switching transistors Q1 through Q16, corresponding to sixteen light emitting diodes LED1 through LED16, respectively, in the indicator 33. These transistors Q1 through Q16 are each connected, at the base electrodes thereof through resistors R1 through R16, respectively, to the output terminals P1 through P16 of the memory 27 and connected at the collector electrodes thereof to the light emitting diodes LED1 through LED16, respectively, while the said transistors are commonly connected at the emitter electrodes thereof through a common diode D17 to an operation mode selecting switch S17-2 to be described subsequently. The operation mode selecting switches S17-1 and S17-2 are provided in a ganged fashion, such that while the one is closed the other is opened, whereas while one is opened the other is closed. The stationary contacts of these switches S17-1 and S17-2 are connected to the positive voltage source $+V_{cc2}$ and the ground E, respectively. The switches S17-1 and S17-2 being structured as described above, only either the decoder 26 or the driver circuit 28 is selectively energized. More specifically, if and when the switch S17-1 is closed, the decoder 26 is enabled and accordingly the indicator 33 is brought in the channel display mode. On the contrary, if and when the switch S17-2 is closed, the driver circuit 28 is enabled and the indicator 33 is brought in the data display mode where the data stored in the memory 27 is displayed.

A preset circuit PRS is further provided for presetting the data to be entered in the random access memory 27 in the control CTL. The preset circuit PRS comprises presetting switches S1-2 through S16-2, and signal level setting switches S18-1 and S18-2 provided to be mutually ganged with each other. The presetting switches S1-2 through S16-2 each comprises three stationary contacts a2, b2 and c2 and one movable contact d2. Of these stationary contacts a2, b2 and c2 of the presetting switches, the first stationary contacts a2 are not used, while the second stationary contacts b2 are connected to the stationary contact f1 of the level setting switch S18-1 and the third stationary contacts c1 are connected to the stationary contact f2 of the level setting switch S18-2. The movable contacts d2 of the presetting switches S1-2 through S16-2 are connected to the output terminals P1 through P16, respectively, of the random access memory 27. These presetting switches S1-2 through S16-2 are adapted to be operated independently of each other. Of these switches, the switches S1-2 through S14-2 are utilized to set the rate of frequency division to be performed by the programmable frequency divider 17, while the remaining switches S15-2 and S16-2 are utilized to set the receiving bands. The movable contact e1 of the signal level setting switch S18-1 is connected to the positive voltage source $+V_{cc2}$ and the movable contact e2 of the signal level setting switch S18-2 is connected to the ground E.

It is to be particularly noted in the embodiment shown that the channel skip instructing switches S1-1 through S16-1 and the presetting switches S1-2 through S16-2, respectively, are provided so as to be ganged with each other, whereby the number of knobs to be provided on the control panel of the receiver can be decreased.

Now, with simultaneous reference to FIG. 1, the operation of the FIG. 2 embodiment will be described by classifying the same as a data writing mode, a channel selecting mode, and a stored data displaying mode.

(1) Data Writing Mode

In the data writing mode, the data concerning a band and a frequency in the said band which the operator desires to receive is preset for each channel and is entered in the channel selection memory 27. In this mode, the preset switch PRS is turned to either the stationary contact b2 or c2 for the purpose of signal level setting. The switches S1-1 through S16-1 are also set to either of the stationary contacts b1 and c1. It is to be pointed out that the foregoing description should be noted before entering into description of the data writing mode.

At the outset, the operation mode selecting switch S17-1 is closed and accordingly the switch S17-2 is opened. Then the decoder 26 is supplied with a voltage and is energized, so that the light emitting diodes LED1 through LED16 become available for channel display. In such a situation, the automatic scanning/manual scanning selection switch S20 is turned to the manual side. Thereafter, the normally open or self return type channel shift instructing switch S21 is depressed in the arrow direction as shown in the Figure, so that the first channel is selected at first. As a result, only the light emitting diode LED1 corresponding to the first channel is energized to emit light.

Then, the logic level setting switches S18-1 and S18-2 are closed. As a result, the stationary contact b2 of the switches S1-2 through S16-2 are supplied with the positive potential and the stationary contacts c2 of the switches S1-2 through S16-2 are supplied with the ground potential. Then, the presetting switches S1-2 through S16-2 are set in accordance with a binary code table, not shown, prepared in advance to the operator to provide the data concerning the bands and the frequencies in the respective bands in terms of a binary code. More specifically, in order to set the corresponding output terminal of the memory 27 to the high level or the logic one, the presetting switch is turned to the second stationary contact b2 connected to the voltage source $+V_{cc2}$, and in order to set the corresponding output terminal of the memory 27 to the low level or the logic zero, the presetting switch is turned to the third stationary contact C2 connected to the ground E.

After each of the presetting switches S1-2 through S16-2 is turned to a prescribed stationary contact, the normally open switch S19 of the write clock pulse generator 29 is closed. Accordingly, the pulse generator 30 serves to generate clock pulses, so that two one shot multivibrators 31 and 32 are operated. Since the width of the pulse generated by the one shot multivibrator 31 has been made two times as wide as the width of the pulse generated by the one shot multivibrator 32, two series of the pulses of different pulse width are applied to the channel selection memory 27. Thus, the first channel data is written into the channel selection memory 27.

Then the channels are changed sequentially by operating the channel shift instructing switch S21, while substantially the same steps as described above are taken for each channel, whereby the data concerning the desired bands and frequencies is entered in the channel selection memory 27 on a channel by channel basis.

(2) Channel Selecting Mode

After all the required data concerning all the channels is entered in the channel selection memory 27, the level setting switches S18-1 and S18-2 are opened. Thereafter, the auto/manual selecting switch S20 is turned to the auto side to achieve an automatic channel selecting mode, or is turned to the manual side, whereupon the manual switch S21 is depressed, to achieve the manual channel selection mode. In case of the automatic channel selecting mode, the pulses are automatically generated from the astable multivibrator 24 and are counted sequentially by the counter 25. In case of the manual channel selecting mode, each time the manual switch S21 is depressed the pulses are generated from the astable multivibrator 24.

The channel setting output thus obtained by counting the number of pulses by the counter 25 as described above is applied to the decoder 26 and also to the channel selection memory 27. Accordingly, the counter output applied to the decoder 26 is decoded, so that the light emitting diodes LED1 through LED16 corresponding to the output from the decoder 26 are energized to emit light, thereby to indicate the channel received. On the other hand, the counter output applied to the channel selection memory 27 is decoded by means of the decoder 271 (FIG. 3) included in the memory 27, thereby to address the memory locations corresponding to the set channels. In accordance with the said addressing, the output read out from the corresponding address is withdrawn from the output terminals P1 through P16 of the memory 27. The output thus read out is applied to the programmable frequency divider 17, thereby to determine the rate of frequency division by the divider 17 and the bands to be selected. More specifically, the phase locked loop is formed in the local oscillating circuit 13 and the receiver serves as a scanning receiver of a frequency synthesizer type, such that a broadcasting wave of a predetermined frequency is received in accordance with the data stored in the channel selection memory 27 for each channel.

(3) Stored Data Displaying Mode

In order to display the data stored in the channel selection memory 27, it is necessary to enable the driver circuit 28. To that end, the operation mode selecting switch S17-2 is closed and accordingly the switch S17-1 is opened. As a result, the power supply to the decoder 26 is interrupted, so that the decoder 26 is disabled. Therefore, the light emitting diodes LED1 through LED16 do not serve to display the channel. On the contrary, the driver circuit 28 is enabled, and the emitter electrodes of the switching transistors Q1 through Q16 are connected to the ground E. Therefore, the switching transistors coupled to the output terminals on the memory 27 which have been set to the high level or the logic one become conductive and the light emitting diodes coupled to the collector electrodes of the conducting transistors are caused to emit light. Since the switching transistors coupled to the output terminals of the memory 27 set to the low level or the logic zero do not become conductive, the light emitting diodes coupled to the collector electrodes of these non-conducting transistors are not caused to emit light. It is to be noted that, in case of the displaying mode, whichever stationary contacts have been selected by the gang switches S1-1 through S16-1 and S1-2 through S16-2, no influence is caused thereby to the displaying mode. The reason is that in either of these sets of switches the first contact a2 is not used while the first, second and third stationary contacts a1, b1 and c1 of one set of switches are not related with anything because the decoder 26 has been disabled and the second and third stationary contacts b2 and c2 of the other set of switches are neither used since the logical signal level setting switches S18-1 and S18-2 have been opened.

Based on the above described background information, description will be made of the operation for reading out the data stored in the channel selection memory 27 corresponding to a desired channel. At first, the auto/manual scanning selection switch S20 is turned to the manual side and the channel shift instructing switch S21 is operated, thereby to select a desired channel. The output from the counter 25 corresponding to the selected channel serves to address the channel selection memory 27, as in case of the above described channel selecting operation. The memory 27 is responsive to the above described addressing to provide a combination of the high level or the logic one and the low level or the logic zero at the output terminals P1 through P16 of the memory 27. As described above, the light emitting diodes corresponding to the output which has been brought to the high level or the logic one are caused to emit light, while the light emitting diodes corresponding to the output which has been brought to the low level or the logic zero are deenergized, whereby the data stored in the channel selection memory 27 in the corresponding channel is displayed by the light emitting diodes LED1 through LED16. Thus it is appreciated that the data stored in the channel selection memory 27 in any of channels can be displayed by the use of the light emitting diodes LED1 through LED16 which were utilized for the purpose of channel indication.

In the foregoing, description was made of a case where presetting was effected starting from the first channel and after all the channels are preset the data stored in the channel selection memory 27 is displayed by the use of the light emitting diodes LED1 through LED16. However, the present invention is not limited to such an instance. For example, the presetting may be started from any channel. Display may be made such that the data stored in the channel selection memory 27 is displayed by the light emitting diodes each time one channel is preset, in order to confirm the stored data each time the data is stored for each channel. Of course, the channel the operator thinks is not necessary may not be preset in the memory 27.

As described above, a scanning receiver is generally adapted such that an undesired channel is made forcibly unreceivable so that the said channel is automatically skipped in the scanning operation. In order to disable reception of an undesired channel in a scanning receiver of a phase locked loop frequency synthesizer type, those skilled in the art might think of providing a channel skip instructing switch so as to disable the operation of a voltage controlled oscillator constituting the phase locked loop if and when the said channel is selected in the course of the scanning operation. However, if the voltage controlled oscillator is once disabled to stop the operation thereof, a time is required until the voltage controlled oscillator starts again the operation to come to oscillate at a predetermined frequency. Therefore, it is necessary to select the time period required for shifting of one channel in the scanning operation to be longer than the lock up time. As a result, a much longer time is required for the scanning in the automatic scanning operation, particularly in case of a larger number of channels. In order to solve the above described shortcomings, it is desired to provide an improved circuit wherein an undesired channel is forcibly made unreceivable without stopping the operation of the voltage controlled oscillator, whereby the said channel is automatically skipped in the scanning operation, while any noise which might be caused when the channel set to be unreceivable is selected in the scanning can be prevented. An embodiment achieving that purpose is shown in FIG. 3.

Figure 3:
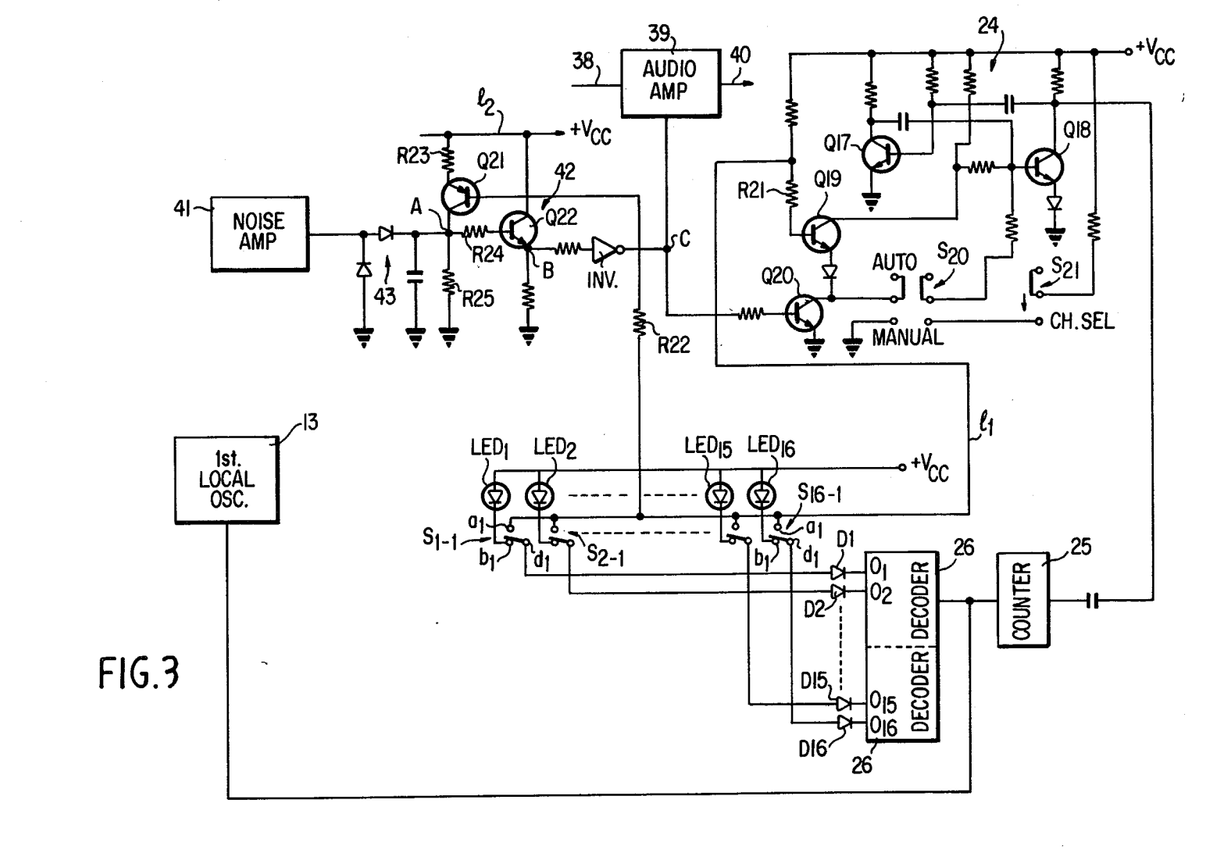
FIG. 3 is a schematic diagram showing in more detail a scanning receiver wherein at least one channel is made unreceivable out of a plurality of channels being sequentially selected in the scanning operation, while the said channel is automatically skipped in the scanning operation by means of a channel skip instructing switch.

Referring to FIG. 3, there is shown a schematic diagram of a major portion of a scanning receiver in which the channel skip instructing switch is provided for making unreceivable at least one channel out of a plurality of channels and for automatically skipping the said channel in the scanning operation. The FIG. 3 embodiment directed to an improvement in the squelch circuit 42 shown in FIG. 2. Therefore, the indicator 33 has been shown in a simplified manner and the control CTL has been omitted. The squelch circuit 42 comprises a transistor Q22 and an inverter INV for inverting the output obtainable from the emitter electrode of the transistor Q22. The base electrode of the transistor Q22 is connected through a resistor R24 to an output node A of a rectifying circuit 43 for rectifying the output from the noise amplifier 41. The output terminal (the point C) of the above described inverter INV is connected to the audio amplifier 39 and is also connected to the base electrode of a transistor Q20.

Referring to FIG. 3, it is particularly noted that the embodiment shown has been adapted such that if and when the channel set to be unreceivable by any one of the channel skip instructing switches S1-1 through S16-1 is selected by the receiver, the audio amplifier 39 is disabled, thereby to suppress the sound output, even if a broadcasing signal is received in the said channel. To that end, a transistor Q21 for controlling the squelch circuit is provided between the said noise amplifier 41 and the said squelch circuit 42. The transistor Q21 is connected, at the base electrode thereof, through a resistor R22, to a line l1 connected to the first stationary contacts a1 of the channel skip instructing switches S1-1 through S16-1, and connected, at the emitter and collector electrodes thereof, to the voltage source +Vcc and the input terminal of the squelch transistor Q22 constituting the said squelch circuit 42. More specifically, the emitter electrode of the transistor Q21 is connected through a resistor R23 to the voltage source supply line l2, and the collector electrode of the transistor Q21 is connected to the junction A (the output terminal of the said rectifying circuit 43) between the resistors R24 and R25 connected to the base electrode of the squelch transistor Q22.

Now description will be made of the operation of the FIG. 3 embodiment in the following. It is pointed out that detailed description is also made of the channel skip operation with reference to FIG. 3, which was omitted in the description of the operation of the FIG. 2 embodiment.

[I] In case where all the channel skip instrucing switches S1-1 throughs S16-1 are turned to the second stationary contact b1 (non-skip instructing side)

①Operation in case of automatic scanning (in case where the automatic scanning/manual scanning correcting switch S20 is turned to the automatic scanning side)

(i) In case where no broadcasting signal is received

Since the rectified output is obtained from the output terminal (the point A) of the noise amplifier 41, the potential at the point A becomes the high level, so that the squelch transistor Q22 becomes conductive and the potential at the emitter electrode (the point B) of the transistor Q22 becomes the high level. The potential at the output terminal of the inverter INV (the point C) becomes the low level and the transistor Q20 is turned off. Accordingly, the transistor Q19 is turned off and the transistor Q18 is turned on, so that the astable multivibrator 24 becomes operative to provide the pulses, which are counted by the pulse counter 25, whereby the automatic scanning operation is repeated until receipt of a broadcasting signal.

The potential at the point C remains in the low level and the audio amplifier 39 is placed in a disabled condition, so that no sound output is produced.

(ii) In case where a broadcasting signal is received

Since no output is obtained from the noise amplifier 41, the potential at the point A becomes the low level and accordingly the potential at the point C becomes the high level, so that the transistors Q20 and thus Q19 are turned on. Accordingly, the transistor Q18 is turned off, whereby the astable multivibrator 24 is disabled thereby to discontinue oscillation. As a result, the broadcasting signal is kept received by the receiver. At the same time, the potential at the point C becomes the high level, so that the audio amplifier 39 becomes operative, whereby a sound output is produced by the speaker 40.

Now assuming that the channel skip instructing switch corresponding to the said receiving channel is turned from the second stationary contact b1 to the first stationary contact a1 (channel skip instructing side), the light emitting diode for displaying the channel corresponding to the said receiving channel is turned off and the potential of the line 11 connected to the output terminal of the decoder 26 where the potential has become the low level. Accordingly, the channel skip instructing transistor Q19 is forcibly turned off and the transistor Q18 is turned on, so that the astable multivibrator 24 becomes operative, whereby the corresponding channel is skipped and the automatic scanning operation is regained. Thus, the transistor Q21 is turned on and the potential at the point A is brought to the high level. Accordingly, the potential at the point C becomes the low level, thereby to disable the low frequency amplifier 39 to suppress the sound output.

As described in the foregoing, even when a broadcasting signal is received, the squelch circuit 42 may be enabled thereby to disable the low frequency amplifier 39 and at the same time skip the channel in the scanning operation, by turning the channel skip instructing switch to the channel skip instructing side. This means that it is possible to skip a channel without stopping the oscillating operation of the voltage controlled oscillator 16.

Now considering a case where the transistor Q21 had not been provided, the channel skipping operation would be achieved even in such a case. However, since the voltage controlled oscillator 16 is kept operating, the squelch circuit 42 does not operate when a broadcasting signal is received in the said channel, so that the low frequency amplifier 39 remains operating, with the result that a noise is produced during the channel is shifted in the scanning operation. Even in case where no broadcasting signal is received in a given channel, if the scanning operation is performed without making the squelch circuit operative, a noise is produced during the skipping operation of the said channel.

②Operation in case of manual scanning (in case where automatic scanning/manual scanning selecting switch S20 is turned to the manual side)

Since the emitter electrode of the channel skip transistor Q21 is normally grounded and one end of the line 11 is opened, the transistor Q19 is turned on and the transistor Q18 is turned off, so that the astable multivibrator 24 is disabled to stop oscillation, whereby the corresponding channel is locked.

Now assuming that the normally open channel shift instructing swich S21 is depressed in the arrow direction, the transistor Q18 is turned on and the potential at the collector electrode of the transistor changes from the high level to the low level, whereby a signal negative pulse is produced at the collector electrode of the transistor Q18, which pulse is applied to the pulse counter 25 and the channel is shifted by one. Likewise, each time the channel shift instructing switch S21 is depressed, the channel is shifted one by one. Whenever a broadcasting wave is received in the selected channel, the potential at the point A becomes the low level and the potential at the point C becomes the high level, whereby the low frequency amplifier 39 becomes operative, thereby to produce a sound output.

Now assuming that the channel skip instructing switch corresponding to the channel where a broadcasting signal is received is turned from the second stationary contact b1 to the first stationary contact a1, the light emitting diode for displaying the channel corresponding to the said receiving channel is turned off and the potential at the line 11 becomes the low level. Accordingly, the channel skip transistor Q19 is turned off and the transistor Q18 is turned on, whereby a pulse is generated and a channel is shifted by one. When the channel is shifted by one, the potential at the line 11 becomes the high level and the transistor Q19 is immediately turned on, whereby the transistor Q18 is turned off and the channel is again locked. In such a time period the transistor Q21 is turned on and the potentials at the points A and C becomes the high level and the low level, respectively, so that the low frequency amplifier 39 becomes disabled, thereby to suppress a sound output.

[II] In case where the channel skip instructing switch is turned to the first stationary contact a1 (skip instructing side is selected)

①Operation in case of automatic scanning (i) In case where no broadcasting signal is received in the channel Since the potentials at the points A and C become the high level and the low level, respectively, the transistor Q20 is turned off. Accordingly, the transistor Q19 is also turned off irrespective of the potential at the line 11 and the transistor Q18 is turned on, so that the astable multivibrator 24 becomes operative, whereby the said channel is skipped and the automatic scanning operation is continued thereafter. The fact that the channel skip instructing switch corresponding to the said channel has been turned to the channel skip instructing side is known by the deenergized state of the light emitting diode for displaying the channel corresponding to the said channel.

(ii) In case where a broadcasting signal is received in the channel

Since the potential at the line 11 is in the low level, the channel skip instructing transistor Q19 is turned off and the transistor Q18 is turned on, so that the astable multivibrator 24 becomes operative, whereby the said channel is skipped and the automatic scanning operation is continued thereafter. At that time, the transistor Q21 is turned on and the potential at the point A becomes the high level and the potential at the point C becomes the low level, so that the low frequency amplifier 39 becomes inoperative, thereby to suppress the sound output.

②Operation in case of manual scanning

Since the potential at the line 11 becomes the low level, the channel skip instructing transistor Q19 is turned off and the transistor Q18 is turned on, whereby a pulse is generated and the channel is shifted by one. During that time period the transistor Q21 is turned on, so that the potentials at the points A and C become the high level and the low level, respectively, even if a broadcasting signal is received in the said channel, with the result that the low frequency amplifier 39 becomes inoperative, thereby to suppress the sound output.

Thus, in the FIG. 3 embodiment, if and when only the channel skip instructing switch corresponding to an undesired channel is turned to the channel skip instructing side, then the said undesired channel can be skipped without stopping the operation of the voltage controlled oscillator even in either case, the automatic scanning operation or the manual scanning operation, whereupon further scanning can be continued. In such a case irrespective of whether a broadcasting signal is received or not, the squelch circuit may be made operative and thus the low frequency amplifier may be disabled, whereby any signal sound for a noise can be prevented from being produced.

It would be appreciated that the FIG. 3 embodiment has been structured such that skillful use is made of the level shift of the potential from the high level to the low level at the channel skip instructing stationary contact of the channel skip instructing switch which had been turned to the channel skip instructing side occurring when the said channel is selected and the said potential shift is applied to the squelch control transistor Q21 as a control voltage. However, the present invention is not limited to such an embodiment. For example, the above described controlled voltage obtainable at the time of channel skipping may be utilized to enable a bypass circuit for bypassing the audio signal, thereby to suppress the sound output.

The FIG. 3 embodiment was described as embodied in a scanning receiver of a phase locked loop frequency synthesizer type.

Figure 5:
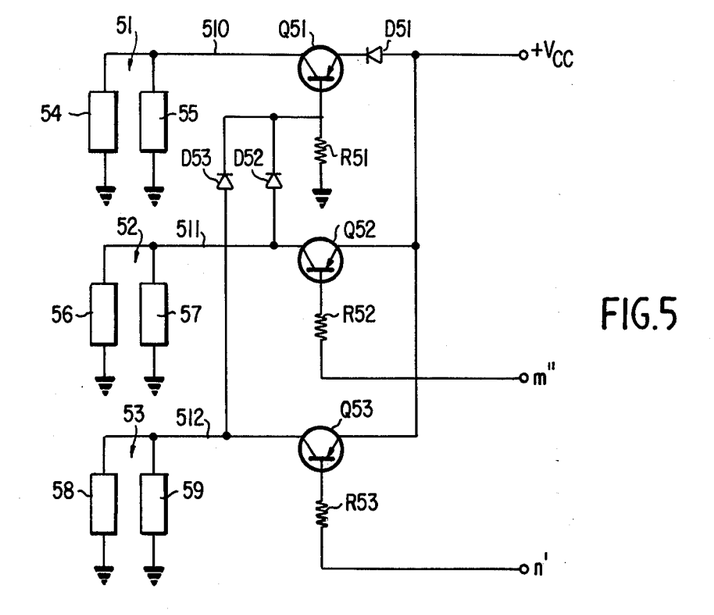
FIG. 5 is a schematic diagram of a band switching circuit employed in a 3-band scanning receiver shown in FIG. 1.

FIG. 5 is a schematic diagram of a major portion of the band switching circuit for use in the 3-band scanning receiver shown in FIG. 1. The band switching circuit shown comprises a low VHF band switching transistor Q51, a high VHF band switching transistor Q52 and a UHF band switching transistor Q53. These transistors each are of a PNP type and connected in a common base type. The emitter electrodes thereof are connected to the voltage source $+V_{CC}$ and the collector electrodes thereof are connected to voltage supply lines 510, 511 and 512, respectively, connected to high frequency amplifiers 54, 56 and 58, constituting the respective high frequency stages 51, 52 and 53, respectively, and mixers 55, 57 and 59, respectively. A diode D51 is connected in the polarity shown between the emitter electrode of the said low VHF switching transistor Q51 and the voltage source $+V_{CC}$, while diodes D52 and D53 are connected between the respective collector electrodes of the said high VHF and UHF switching transistors Q52 and Q53, respectively, and the base electrode of the low VHF switching transistor Q51. Resistors R51, R52 and R53 are connected to the bases of the said transistors Q51, Q52 and Q53, respectively.

Now description will be made of the band switching operation in the following with reference to FIG. 5. If and when the high level or the logic one is applied to the input terminals m' and n' of the high VHF and UHF switching transistors Q52 and Q53, the switching transistors Q52 and Q53 are both turned off. Accordingly, the diodes D52 and D53 are also turned off, so that the base input of the low VHF switching transistor Q51 becomes the low level or the logic zero and the transistor Q51 is turned on. Therefore, only the radio frequency amplifier 54 and the mixer 55 are energized for the low VHF selecting purpose.

Now assuming that the low level or the logic zero is applied to the input terminal m' and the high level or the logic one is applied to the input terminal n', the UHF switching transistor Q53 is turned off and the high VHF switching transistor Q52 is turned on. At that time the diode D52 is also turned on, so that a portion of the collector current of the switching transistor Q52 flows through the diode D52 and the resistor R51. Assuming that the voltage drop accross the base-emitter junction of the switching transistor Q51 is $V_{BE}$, the voltages accross the diodes D51 and D52 are $V_{D51}$ and $V_{D52}$, respectively, the saturated voltage accross the collector-emitter junction of the swtiching transistor Q52 is $V_{CES}$, and the source voltage is $V_{CC}$, when in order for the base current to flow through the low VHF switching transistor Q51, so that the transistor Q51 becomes conductive, the following equation must be satisfied.

$$(V_{CC} - V_{D51}) - (V_{CC} - C_{CES} - V_{D52}) > V_{BE} \quad (1)$$

From the equation (1), the following equation is obtained.

$$V_{D51} + V_{BE} < V_{D52} + V_{CES} \quad (2)$$

Unless the above described condition is met, the switching transistor Q51 does not become conductive. Meanwhile, in case of a typical silicon transistor, $V_{BE} = 0.6 \sim 0.7V$, $V_{CES} = 0.08V$, and $V_{D51} \approx V_{D52}$. Therefore the following equation is obtained.

$$V_{D51} + V_{BE} > V_{D52} + V_{CES} \quad (3)$$

Thus, the equation (2) is not established. Accordingly, the switching transistor Q51 does not become conductive. Therefore, only the high VHF switching transistor Q52 becomes conductive and the radio frequency amplifier 56 and the mixer 57 are energized for the high VHF band selecting purpose.

Now assuming that the high level or the logic one is applied to the input terminal m' and the low level or the logic zero is applied to the input terminal n', the high VHF switching transistor Q52 is turned off and the UHF switching transistor Q53 is turned on. At that time the diode D53 is also turned on and, for the same reason as described above, the low VHF switching transistor Q51 is also turned off. Accordingly, at that time only the UHF switching transistor Q53 becomes conductive and only the radio frequency amplifier 58 and the mixer 59 are energized for the UHF band selecting purpose.

From the foregoing description, the relation between the control input signals applied to the input terminals m' and n' of the high VHF and UHF switching transistors Q52 and Q53 and the switching transistors in conduction is obtained as shown in the Table.

Table

| input | | conducting |
|---|---|---|
| m' | n' | transistor |
| 1 | 1 | Q51 |
| 0 | 1 | Q52 |

Table-continued

| | input | conducting |
|---|---|---|
| m' | n' | transistor |
| 1 | 0 | Q53 |

From the foregoing description, it would be appreciated that the FIG. 5 embodiment of the band switching circuit enables the band switching of a plurality (N) of bands by the use of a one less plurality (N − 1) of control inputs.

The FIG. 5 embodiment was structured such that the respective switching devices were implemented by PNP type switching transistors and the radio frequency amplifiers and mixers constituting the respective band high frequency stages are selectively energized by the use of the respective switching transistors, thereby to achieve the band switching operation. However, the present invention is not limited to such an embodiment. For example, an NPN type transistor may be used as a switching transistor. A power supply may be selectively switched to only one of the mixers constituting the respective band high frequency stages for the band switching purpose. Alternatively, the band switching can be achieved by controlling the signal transmission path in the respective high frequency stages.

Figure 6:
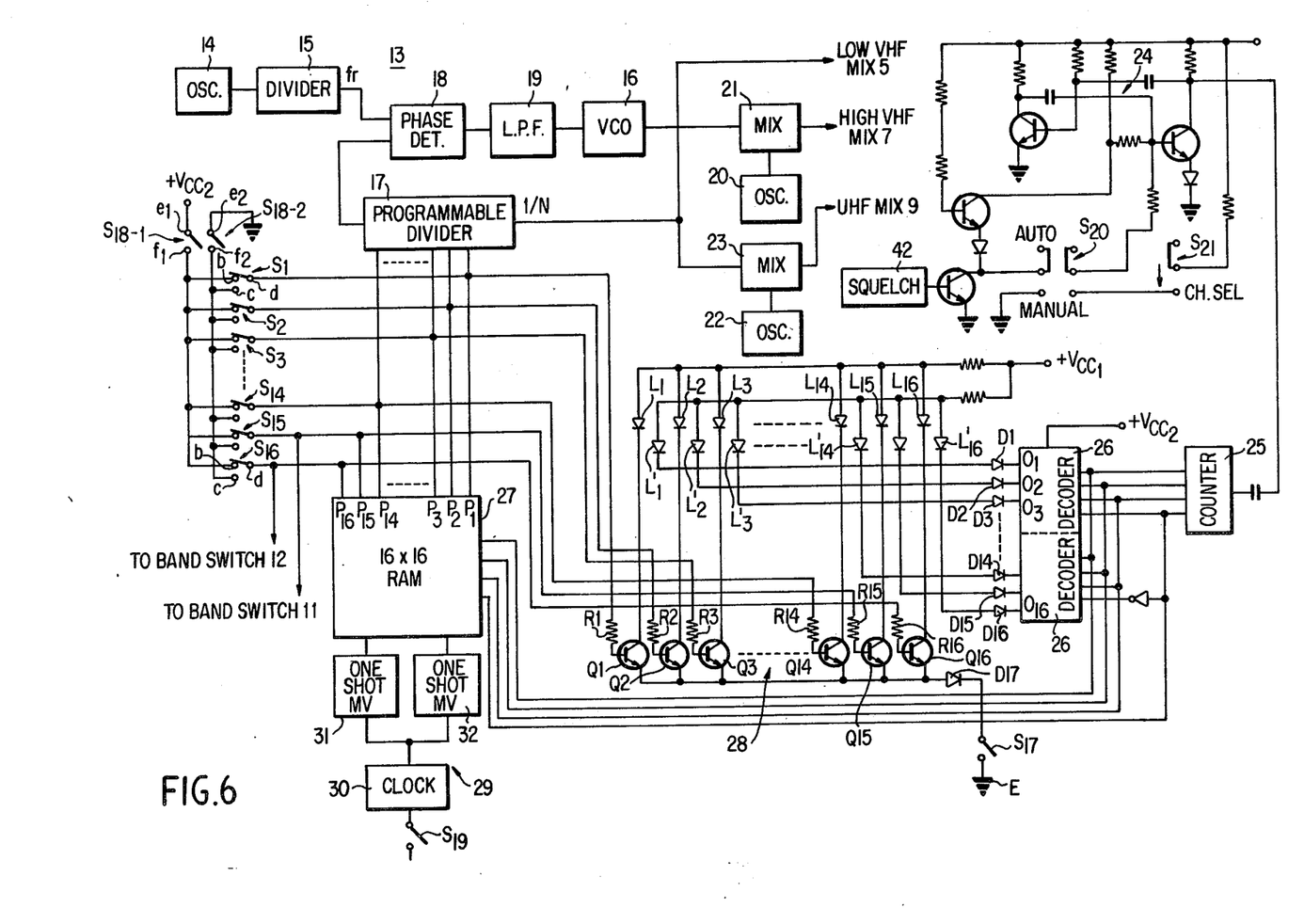
FIG. 6 is a schematic diagram of another embodiment similar to the FIG. 2 embodiment wherein the portion of the indicator 33 in FIG. 2 has been modified.

FIG. 6 shows a schematic diagram of another embodiment of only the portion of the indicator 33 in the FIG. 2 embodiment. In the embodiment shown, two groups of light emitting devices are employed, one being used for indicating the data of a binary coded signal loaded in the channel selection memory and the other being used for displaying the receiving channel. Referring to FIG. 6, two groups of light emitting devices constituting the indicator are implemented by the light emitting diodes L1 through L16 and L1' through L16'. One group of the light emitting diodes L1 through L16 are utilized for displaying the data stored in the channel selection memory 27. To that end, the respective anodes are coupled commonly to the positive voltage source $+V_{CC1}$ and respective cathodes are coupled to the collector electrodes of the corresponding transistors Q1 through Q16 included in the driver circuit 28. The other group of the light emitting diodes L1' through L16' are utilized for indicating the receiving channel. To that end, the respective anodes are commonly connected to the positive voltage source $+V_{CC1}$ and the respective cathodes are connected to the corresponding output terminals of the decoder 26. It is to be particularly noted that, as different from the FIG. 2 embodiment, the decoder 26 is fixedly connected to the positive voltage source $+V_{CC2}$, while the driver circuit 28 is grounded through the switch S17. As understood from such a circuit configuration, the receiving channel is always indicated by the corresponding one of the light emitting diodes L1' through L16', while the data stored in the memory 27 is displayed by the light emitting diodes L1 through L16 by closing the switch S17 of the driver circuit 28. Therefore, it is possible to load the data in the memory 27 with extreme ease and accuracy by presetting the data such that the lighted state of the light emitting diode L1 through L16 may be consistent with the binary code table.

Figure 7:
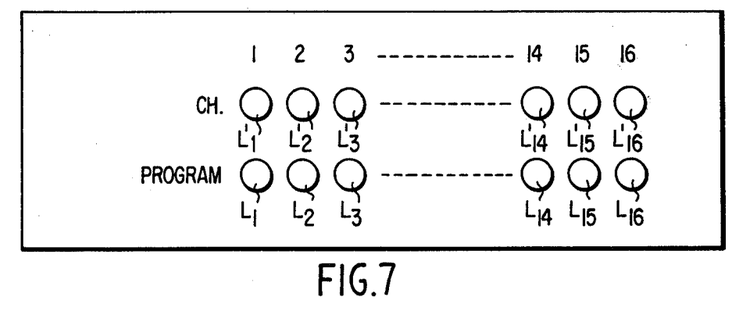
FIG. 7 shows an example of the display portion in the front panel of a scanning receiver employing the indicator shown in FIG. 6.

FIG. 7 shows a view of the front panel of the receiver employing the FIG. 6 indicator. The light emitting diodes L1 through L16 for displaying the data stored in the channel selection memory and the light emitting diodes L1' through L16' for displaying the receiving channel are arranged in juxtaposition.

Since the light emitting diodes L1 through L16 for displaying the data stored in the memory and the light emitting diodes L1' through L16' for displaying the receiving channel are arranged separately, these two groups of the light emitting diodes may be of the same light emitting color. Employment of the light emitting diode groups of different colors makes the display more clear, however.

Although the present invention has been described and illustrated in detail, it is to be clearly understood that the same is by way of illustration and example only and is not to be taken by way of limitation, the spirit and the scope of the present invention being limited only by the terms of the appended claims.

What is claimed is:

1. A superheterodyne receiver of a scanning type, comprising means for selectively receiving a high frequency signal including one of a plurality of channels of different frequencies, local oscillator means for providing an oscillation frequency signal the frequency of which is different by a given frequency difference from the frequency of said received high frequency signal, mixing means responsive to said received high frequency signal and said local oscillation frequency signal for providing an intermediate frequency signal, means for amplifying the intermediate frequency signal from said mixing means, means for detecting the intermediate frequency output from said intermediate frequency amplifying means for providing an audio frequency signal, and means for amplifying the audio frequency signal from said detecting means; said local oscillator means comprising voltage controlled oscillator means for providing an oscillation frequency signal the oscillation frequency of which is variable as a function of a control voltage, means for modifying the oscillation frequency of the output from said voltage controlled oscillation means, means for controlling the rate of frequency modification of said oscillation frequency modifying means, means responsive to the output from said oscillation frequency modifying means, as modified at the frequency modification rate controlled by said frequency modification rate controlling means, for providing said control voltage associated with the frequency of the output from said oscillating frequency modifying means to said voltage controlled oscillating means, whereby said local oscillating means is adapted to provide a local oscillation frequency signal the frequency of which is associated with the frequency modification rate, as controlled by said frequency modification rate controlling means, said receiver further comprising, scanning signal generating means for controlling said frequency modification rate controlling means to control said oscillation frequency modifying means for scanning the different frequencies of the high frequency signal and sequentially selecting said plurality of channels to be received by said receiver and enabling reception of the frequency of the corresponding channel, means responsive to the absence of the intermediate frequency signal for any one of said plurality of channels for interrupting transmission of said audio frequency signal, means switch for selectively disabling the reception of a given undesired channel out of said plurality of channels being selected by said scanning signal generating means for skipping the reception of said given undesired channel in the scanning operation, and means operatively coupled to said selective disabling means for enabling said audio signal transmission interrupting means when the frequency of said given undesired channel is received.

2. A superheterodyne receiver of a scanning type in accordance with claim 1, in which said control voltage providing means comprises means for providing a reference frequency signal, and means responsive to the output from said oscillation frequency modifying means and the output from said reference frequency signal providing means for detecting the frequency difference between the frequency of the output from said oscillation frequency modifying means and the frequency of said reference frequency signal for providing said control voltage to said voltage controlled oscillator means.

3. A superheterodyne receiver of a scanning type in accordance with claim 1, in which said oscillation frequency modifying means comprises means for dividing the frequency of the output from said voltage controlled oscillator means, and said frequency modification rate controlling means comprises means for controlling the rate of frequency division by said frequency dividing means.

4. A superheterodyne receiver of a scanning type in accordance with claim 3, in which said frequency division rate controlling means comprises means for storing coded information of a plurality of bits concerning the rate of frequency division for the frequencies of said plurality of channels, said storing means comprising a plurality of addresses corresponding to said plurality of channels and a plurality of parallel bit code outputs.

5. A superheterodyne receiver of a scanning type in accordance with claim 4, in which said scanning signal generating means includes means for addressing the corresponding address of said storing means.

6. A superheterodyne receiver of a scanning type in accordance with claim 5 in which said storing means comprises a write/read random access memory, and means operatively coupled to said random access memory for writing coded information of a plurality of bits in the address as addressed by said addressing means.

7. A superheterodyne receiver of a scanning type in accordance with claim 1, in which said selective disabling means comprises first means for presetting said given undesired channel, and means operatively coupled to said first means and responsive to the presence of the intermediate frequency signal for controlling said scanning signal generating means for skipping said given undesired channel when a broadcasting signal is received at the frequency of said given undesired channel.

8. A superheterodyne receiver of a scanning type in accordance with claim 1, in which said audio signal transmission interrupting means comprises squelch circuit means responsive to the absence of the intermediate frequency signal for disabling said audio amplifying means.

9. A superheterodyne receiver of a scanning type in accordance with claim 7, in which said first means comprises a plurality of switch means corresponding to said plurality of channels, operation of a said switch means presetting an undesired channel and producing a control signal for controlling said scanning signal generating means for a skipping operation when a broadcasting signal is received in said given undesired channel, and said means for enabling said audio signal transmission interrupting means comprising means responsive to said control signal applied through said first means for forcibly enabling said squelch circuit means.

10. A multi-band superheterodyne receiver, comprising means for receiving a high frequency signal including one of a plurality of channels of different frequencies in a selected one of a plurality of frequency bands, local oscillator means for providing an oscillation frequency signal the frequency of which is different by a given frequency difference from said received high frequency signal, a respective mixing means for each of said frequency bands responsive to said received high frequency signal and said local oscillation frequency signal for providing an intermediate frequency signal, said receiver further comprising means for selecting a respective one of said plurality of frequency bands, said band selecting means comprising a plurality of selection control inputs, an energization line, and a plurality of switching means of a number corresponding to said plurality of bands for selectively connecting said energization line to at least said mixing means of the band to be selected, said plurality of selection control inputs being of a number less than said plurality of switching means and less than the number of bands, a number of said switching means less than said plurality of switching means each being individually coupled to a respective control input, whereby selected ones of said plurality of frequency bands are selected.

11. A multi-band superheterodyne receiver, comprising means for receiving a high frequency signal including one of a plurality of channels of different frequencies in a selected one of a first plurality of selectable frequency bands, local oscillator means for providing an oscillation frequency signal the frequency of which is different by a given frequency difference from said received high frequency signal, a respective mixing means for each of said first plurality of frequency bands responsive to said received high frequency signal and said local oscillation frequency signal for providing an intermediate frequency signal, said receiver further comprising means for selecting a respective one of said first plurality of frequency bands, said band selecting means comprising a plurality of selection control inputs, an energization line, and a plurality of switching means of a number corresponding to said first plurality of bands for selectively connecting said energization line to said mixing means of the band to be selected, said plurality of selection control inputs being one less than said plurality of switching means and less than the number of bands, a number of switching means less than said plurality of said switching means each being individually coupled to a respective control input, whereby selected ones of said plurality of frequency bands are selected.

12. A multiple-band superheterodyne receiver in accordance with claim 11, in which said plurality of switching means each comprises a switching transistor of the same conduction type and having base, emitter and collector electrodes, each of said switching transistors having the emitter and the collector electrodes coupled to said energization line, diode means connected between the base electrode of one of said plurality of switching transistors and the respective collector electrodes of the remaining switching transistors, respectively, the base electrode of said one of said plurality of switching transistors being connected to a reference potential, whereby at least said mixing means of the respective band is selectively energized upon application of the selection control input to the base electrode of said remaining switching transistors.

13. A multiple-band superheterodyne receiver in accordance with claim 12, in which said switching transistors each comprises a PNP type switching transistor, the emitter electrodes thereof being connected to a voltage source and the collector electrodes thereof being connected to said energization line.

14. A multiple-band superheterodyne receiver in accordance with claim 11, in which said local oscillator means comprises
   voltage controlled oscillator means for providing an oscillation frequency signal the oscillation frequency of which is variable as a function of a given control voltage,
   means for modifying the oscillation frequency of the output from said voltage controlled oscillator means,
   means for controlling the rate of frequency modification of said oscillation frequency modifying means,
   means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillator means, whereby said local oscillator means is adapted to provide a local oscillation frequency signal the frequency of which is associated with the frequency modification rate, as controlled by said frequency modification rate controlling means.

15. A superheterodyne receiver in accordance with claim 14, in which said control voltage providing means comprises
   means for providing a reference frequency signal, and
   means responsive to the output from said oscillation frequency modifying means and the output from said reference frequency signal providing means for detecting the frequency difference between the frequency of the output from said oscillation frequency modifying means and the frequency of said reference frequency signal for providing said control voltage to said voltage controlled oscillator means.

16. A superheterodyne receiver in accordance with claim 14, in which said oscillation frequency modifying means comprises means for dividing the frequency of the output from said voltage controlled oscillator means, and said frequency modification rate controlling means comprises means for controlling the rate of frequency division by said frequency dividing means.

17. A superheterodyne receiver of a scanning type, comprising means for selectively receiving a high frequency signal including a plurality of channels of different frequencies, local oscillator means for providing an oscillation frequency signal the frequency of which is different by a given frequency difference from the frequency of said received high frequency signal, and mixing means responsive to said received high frequency signal and said local oscillation frequency signal for providing an intermediate frequency signa; said local oscillator means comprising
   voltage controlled oscillator means for providing an oscillation frequency signal the oscillation frequency of which is variable as a function of a control voltage,
   means for modifying the oscillation frequency of the output from said voltage controlled oscillator means,
   read-write storing means for storing coded information concerning the rate of frequency modification of said oscillation frequency modifying means for controlling said oscillation frequency modifying means at a plurality of addresses each corresponding to a said one of said plurality of channels, and
   means responsive to the output from said oscillation frequency modifying means, as modified at the frequency modification rate of said coded information stored by said storing means for providing a control voltage associated with the frequency of the output from said oscillation frequency modifying means to said voltage controlled oscillator means, whereby said local oscillator means is adapted to provide a local oscillation frequency signal the frequency of which is associated with the frequency modification rate of said coded information, as stored by said storing means, said receiver further comprising
   scanning signal generating means producing a signal for addressing the corresponding addresses of said frequency modification rate storing means and reading said coded information concerning the frequency modification rate stored in said storing means and thereby scanning the frequencies of said plurality of channels being received by said high frequency signal receiving means for sequentially selecting said plurality of channels,
   means for enabling the operation of said scanning signal generating means,
   means responsive to the output from said scanning signal generating means for displaying the corresponding channel,
   means including addressing means operatively coupled to said frequency modification rate storing means for writing coded information concerning the frequency modification rate in a selected address of said storing means, and
   means for selecting a channel the reception of which is undesired,
   said writing means comprising a plurality of switching means, each being seletively settable at first and second logical levels, and
   said undesired channel selecting means comprising a plurality of switching means, each being ganged with said switching means of said writing means and selectively settable at a first position for connection to said means for enabling said scanning signal generating means and in a second position for connection to said displaying means.

18. A superheterodyne receiver of a scanning type in accordance with claim 17, in which said scanning signal generating means comprises pulse generating means, means for counting the output from said pulse generating means, and means for decoding the count output from said counting means for providing a plurality of decoded parallel individual bit outputs to said addressing means, said displaying means including a plurality of display devices each being connected to the corresponding individual bit output of said decoding means in the second switched position of the corresponding switching means in said undesired channel selecting means.

* * * * *